(12) United States Patent
Chou

(10) Patent No.: US 7,410,362 B2
(45) Date of Patent: Aug. 12, 2008

(54) CONNECTING STRUCTURE OF PRINTED CIRCUIT BOARD OF LIQUID CRYSTAL DISPLAY MODULE

(75) Inventor: Yung-Wei Chou, Jiangsu (CN)

(73) Assignee: Wintek Corporation, Taichung County (TW)

( * ) Notice: Subject to any disclaimer, the term of this patent is extended or adjusted under 35 U.S.C. 154(b) by 0 days.

(21) Appl. No.: 11/889,878

(22) Filed: Aug. 17, 2007

(65) Prior Publication Data

US 2008/0045077 A1 Feb. 21, 2008

(30) Foreign Application Priority Data

Aug. 18, 2006 (TW) ............... 95130499 A

(51) Int. Cl.
*H01R 12/00* (2006.01)
(52) U.S. Cl. .......................................................... 439/65
(58) Field of Classification Search ............... 439/65, 439/55, 77, 83
See application file for complete search history.

(56) References Cited

U.S. PATENT DOCUMENTS

| 6,250,933 | B1 * | 6/2001 | Khoury et al. ................. 439/66 |
| 6,496,384 | B1 * | 12/2002 | Morales et al. ............... 361/784 |
| 6,569,710 | B1 * | 5/2003 | Pierson ....................... 438/110 |
| 6,780,028 | B1 * | 8/2004 | Kennedy et al. ............... 439/83 |
| 6,787,903 | B2 * | 9/2004 | Yang ........................... 257/734 |
| 6,809,268 | B2 * | 10/2004 | Hayashi et al. ............. 174/260 |
| 6,958,106 | B2 * | 10/2005 | Antesberger et al. ........ 156/249 |
| 7,056,818 | B2 * | 6/2006 | Yang ........................... 438/612 |
| 7,365,421 | B2 * | 4/2008 | Webster et al. .............. 257/704 |

* cited by examiner

*Primary Examiner*—Chandrika Prasad

(74) *Attorney, Agent, or Firm*—Rabin & Berdo, P.C.

(57) ABSTRACT

A connecting structure of a printed circuit board of a liquid crystal display (LCD) module includes a double side printed circuit board and a single side printed circuit board. With the design of the double side printed circuit board having a solder element with two solder surfaces with a plurality of plated through holes (PTHs), and the design of the opening neighboring the solder element, the conducting surface of the single side printed circuit board may easily accord with the structural requirements to select the corresponding solder surface for performing welding.

11 Claims, 11 Drawing Sheets

CONNECTING STRUCTURE OF PRINTED CIRCUIT BOARD OF LIQUID CRYSTAL DISPLAY MODULE

CROSS-REFERENCE TO RELATED APPLICATIONS

This non-provisional application claims priority under 35 U.S.C. § 119(a) on Patent Application No(s). 095130499 filed in Taiwan, R.O.C. on Aug. 18, 2006, the entire contents of which are hereby incorporated by reference.

BACKGROUND OF THE INVENTION

1. Field of Invention

The present invention relates to a connecting structure of a printed circuit board. More particularly, the present invention relates to a connecting structure of a flexible printed circuit board of a liquid crystal display (LCD) module.

2. Related Art

Recently, because the objectives of the electronic products are light, thin, short and small, many electronic devices develop according to the objectives, and the using of the flexible printed circuit board totally accord with the requirement of the modern technology. In addition, due to the unique flexibility of the flexible printed circuit board, the three-dimensional stereo wiring may be easily accomplished together with the spatial configuration, such that the flexible printed circuit board is widely used, particularly, it is usually applied in the LCD module, so as to serve as the bridge electrically connecting different circuit elements.

Referring to FIG. 1, it is a schematic view of the connecting structure of the flexible printed circuit board of the conventional LCD module. As shown in FIG. 1, the LCD module 10 mainly includes a LCD panel 16, a backlight module 17, a first flexible printed circuit board 13, a second flexible printed circuit board 14 and a mainboard printed circuit board 18.

The LCD panel 16 is connected to the mainboard printed circuit board 18 through the first flexible printed circuit board 13, so as to achieve the signal transmission. The backlight module 17 uses the second flexible printed circuit board 14 as the carrier of the circuit. Usually, the second flexible printed circuit board 14 is connected to the first flexible printed circuit board 13 by welding, and the first flexible printed circuit board 13 is connected to the mainboard printed circuit board 18.

A solder surface 131 is formed on the first flexible printed circuit board 13. The second flexible printed circuit board 14 has an extending portion 15, and a conducting surface 12 is formed on the extending portion 15. Through the welding of the conducting surface 12 and the solder surface 131, the effect of the electrical connection between the LCD panel 16 and backlight module 17 is achieved.

Usually, the first flexible printed circuit board 13 is a double side printed circuit board structure, and its connecting position with the second flexible printed circuit board 14 is at a solder surface 131 on one side of the first flexible printed circuit board 13. The second flexible printed circuit board 14 mainly adopts the double side printed circuit board structure, both of the two sides have a conducting surface 12, and the two conducting surfaces 12 may be welded with the solder surface 131.

As shown in FIGS. 2A and 2B, a sectional view and a top view of the conventional connecting structure of the first flexible printed circuit board of the double side printed circuit board structure and the second flexible printed circuit board of the double side printed circuit board structure are shown. A plurality of first pads 21 and a plurality of second pads 22 are respectively disposed on the solder surface 131 and the conducting surface 12, wherein the area of the first pad 21 may be larger than, equal to or less than the area of the second pad 22. In the figures disclosed by this embodiment, the area of the first pad 21 is larger than the area of the second pad 22. During the welding operation, according to the structural requirements, the second pad 22 on any conducting surface 12 is selected to correspond to the first pad 21 on the solder surface 131 to get into contact with each other. Because the area of the first pad 21 is larger than the area of the second pad 22, the first pad 21 still leaves a protruding portion 21a after contacting, the solder 23 may be welded with the non-contacted second pad 22 through the protruding portion 21a. Moreover, a part of the solder located on the first pad 21 spills to the second pad 22 on the other side through the plated through holes (PTHs) formed on the second pad 22.

Although the above bonding structure is convenient for the bonding process, the second flexible printed circuit board of the double side printed circuit board structure is expensive, and the production cost is increased correspondingly.

Therefore, in order to save the material cost, the conventional method changes to adopt the second flexible printed circuit board of the single side printed circuit board structure, according to different connecting manners, the connecting structures usually have the following two configurations.

As shown in FIGS. 3A and 3B, a sectional view and a top view of the conventional first connecting structure of the first flexible printed circuit board of the double side printed circuit board structure and the second flexible printed circuit board of the single side printed circuit board structure are shown. The second pads 22 disposed on the second flexible printed circuit board and the first pads 21 disposed on the first flexible printed circuit board are not directly contacted, that is, the second pads 22 and the first pads 21 are disposed on the same side of the flexible printed circuit board. During the welding operation, the solder 23 is used to connect the protruding portion 21a of the first pad 21 and the second pad 22. However, whether the strength of the welding structure is appropriate becomes a hidden trouble of the product yield. Usually, in order to make the welding structure have the substantive bonding strength, it is necessary to provide enough amount of solder, thus the tin bead is usually too big, causing the problems on the product assembling or the appearance dimension. On the contrary, if the amount of the solder is not enough, the bonding section is too small, it is impossible to provide enough bonding strength, and the tin crack is easily generated because of the external force, thus resulting in the poor electrical connecting.

As shown in FIGS. 4A and 4B, a sectional view and a top view of the second conventional connecting structure of the first flexible printed circuit board of the double side printed circuit board structure and the second flexible printed circuit board of the single side printed circuit board structure are shown. Different from the connecting method shown in FIGS. 3A and 3B, the second pad 22 and the first pad 21 are bonded by contacting directly. In order to make the solder 23 sandwiched between the solder surface 131 and the conducting surface 12 achieve the melting state, it is necessary to increase the welding temperature and to prolong the welding time. However, the heat energy must be transmitted though the protective layer of the flexible printed circuit board, usually the circuit board is burnt and becomes black. Because the solder 23 is located between the two pads, during the welding process, it is not easy to observe the melting condition of the solder 23, so usually the false bonding occurs, resulting in the poor electrical connecting, and thereby influencing the product yield.

SUMMARY OF THE INVENTION

In view of the above problems, the main objective of the present invention is to provide a connecting structure of the flexible printed circuit board of the LCD module, thereby lowering the cost and solving the problem of the false bonding and the insufficient bonding strength, so as to improve the product yield.

Therefore, in order to achieve the above objective, the present invention provides a connecting structure of the flexible printed circuit board of the LCD module, which comprises a first flexible printed circuit board and a second flexible printed circuit board. The first flexible printed circuit board is a double side printed circuit board structure, and the second flexible printed circuit board is a single side printed circuit board structure. The first and the second flexible printed circuit boards may be a flexible copper clad laminate.

The first flexible printed circuit board has a solder element with two solder surfaces and an opening. The two solder surfaces are formed by the conductive material, such as the metal material. Moreover, the two solder surfaces further comprise a plurality of pads, and at least a PTH is formed on the pads. The opening structure partially surrounds the solder element and may be U-shaped or tetragon-shaped.

The second flexible printed circuit board has an extending portion, and a conducting surface is formed on the end of the extending portion. The conducting surface is formed by the conductive material, such as the metal material, and a plurality of pads are disposed on the conducting surface.

The area of the pad on the solder surface may be larger than, equal to or less than the area of the pad on the conducting surface. The conducting surface may directly select to connect to the corresponding solder surface, or may pass through the opening from one side of the first flexible printed circuit board, so as to connect to the corresponding solder surface on the other side of the first flexible printed circuit board.

By the design of the connecting structure of the first flexible printed circuit board and the second flexible printed circuit board of the present invention, according to the structural requirement of the LCD module, the conducting surface of the second flexible printed circuit board may pass through the opening and select the corresponding solder surface of the first flexible printed circuit board to perform bonding, so as to facilitate the bonding operation, and improve the production performance. Moreover, by the effect of the PTHs, the solder may go deep into the PTHs of the first flexible printed circuit board and obtain the favorable tin feeding effect, so as to increase the bonding strength between the first flexible printed circuit board and the second flexible printed circuit board.

The features and the practices of the present invention are described in detail as the most preferred embodiment with the drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
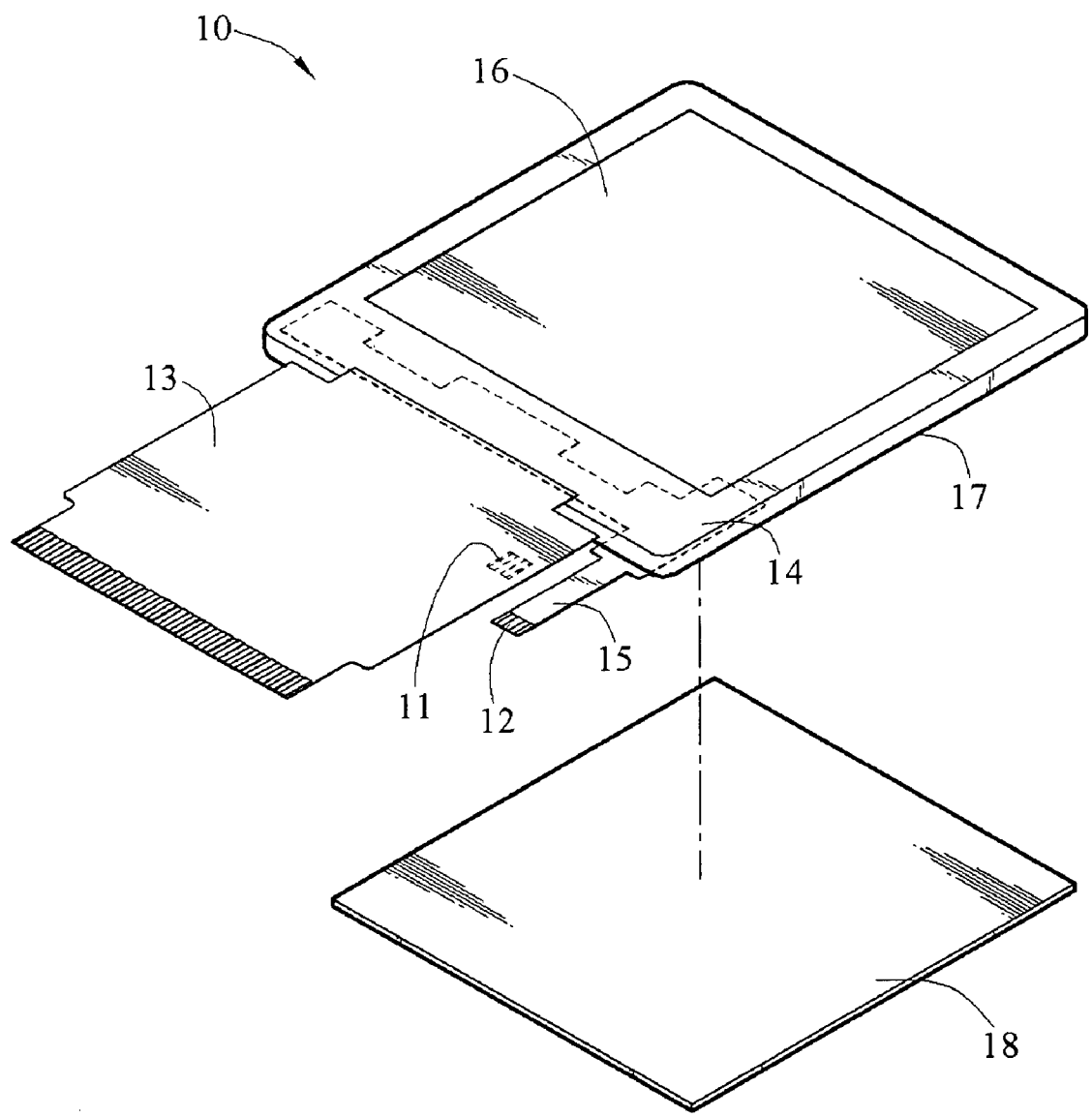
FIG. 1 is a schematic view of the conventional connecting structure of the flexible printed circuit board of the LCD module.
Figure 2A:
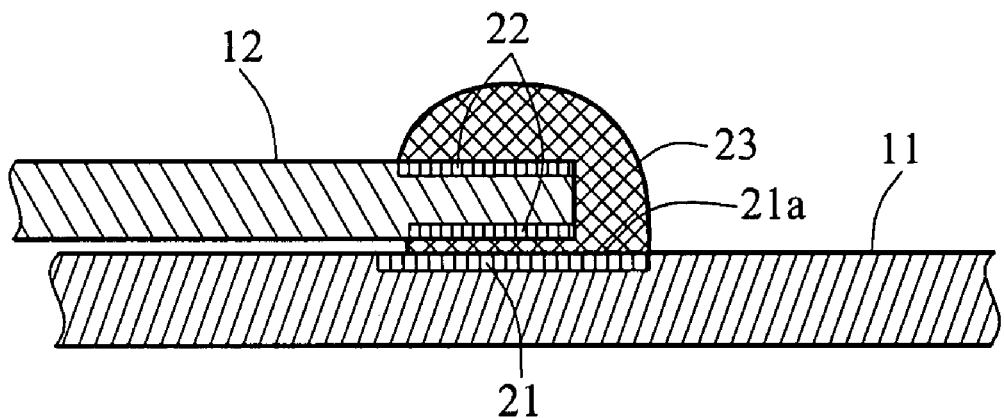
FIGS. 2A and 2B are a sectional view and a top view of the conventional connecting structure of the first flexible printed circuit board of the double side printed circuit board structure and the second flexible printed circuit board of the double side printed circuit board structure.
Figure 2B:
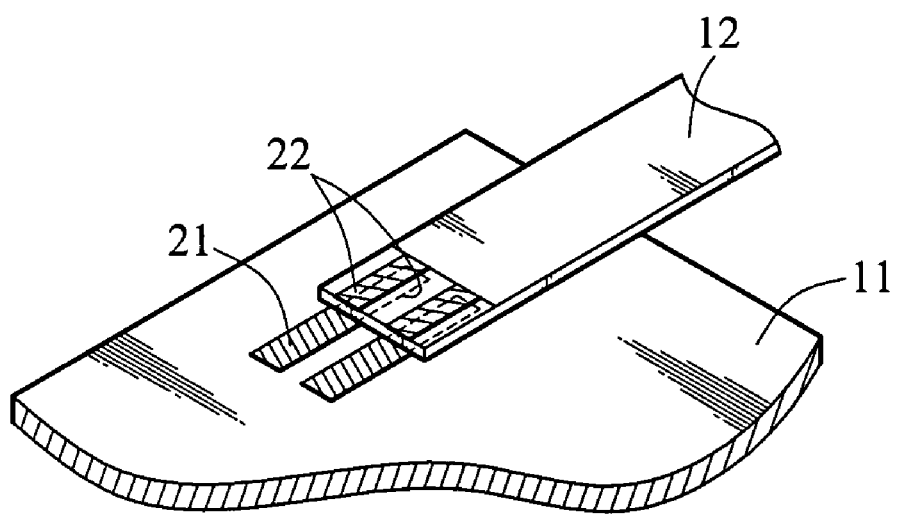
Figure 3A:
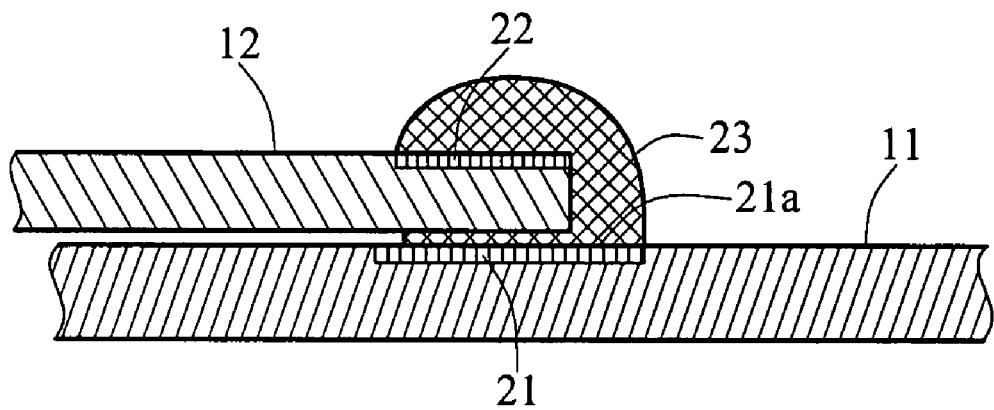
FIGS. 3A and 3B are sectional views of the conventional first connecting structure of the first flexible printed circuit board of the double side printed circuit board structure and the second flexible printed circuit board of the single side printed circuit board structure.
Figure 3B:
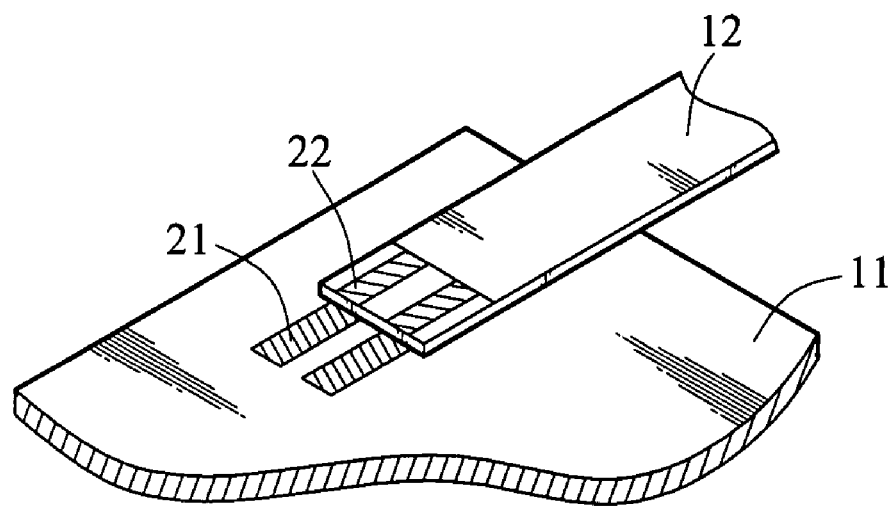
Figure 4A:
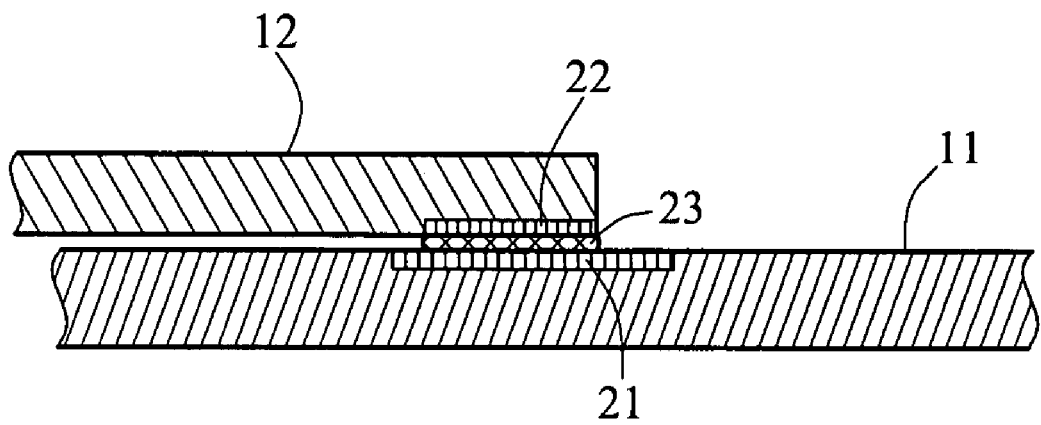
FIGS. 4A and 4B are sectional views of the conventional second connecting structure of the first flexible printed circuit board of the double side printed circuit board structure and the second flexible printed circuit board of the single side printed circuit board structure.
Figure 4B:
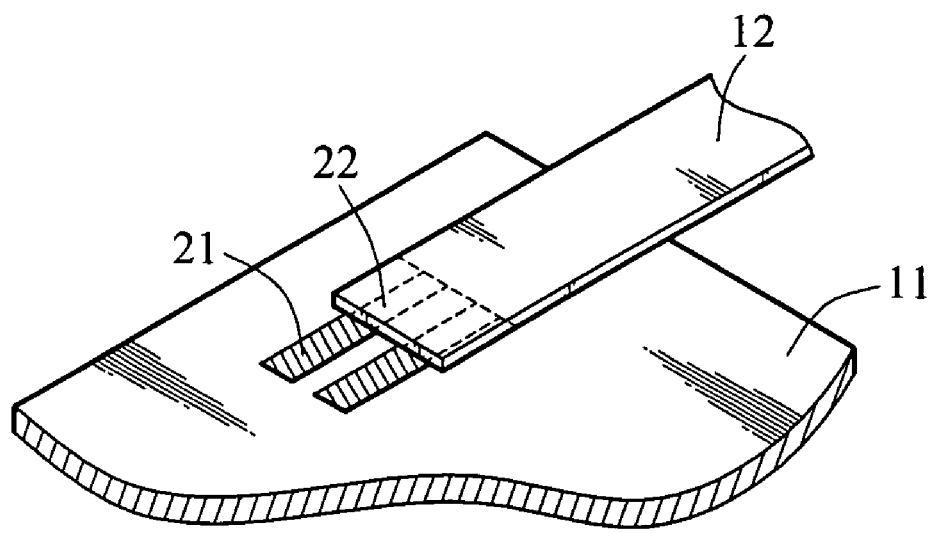
Figure 5A:
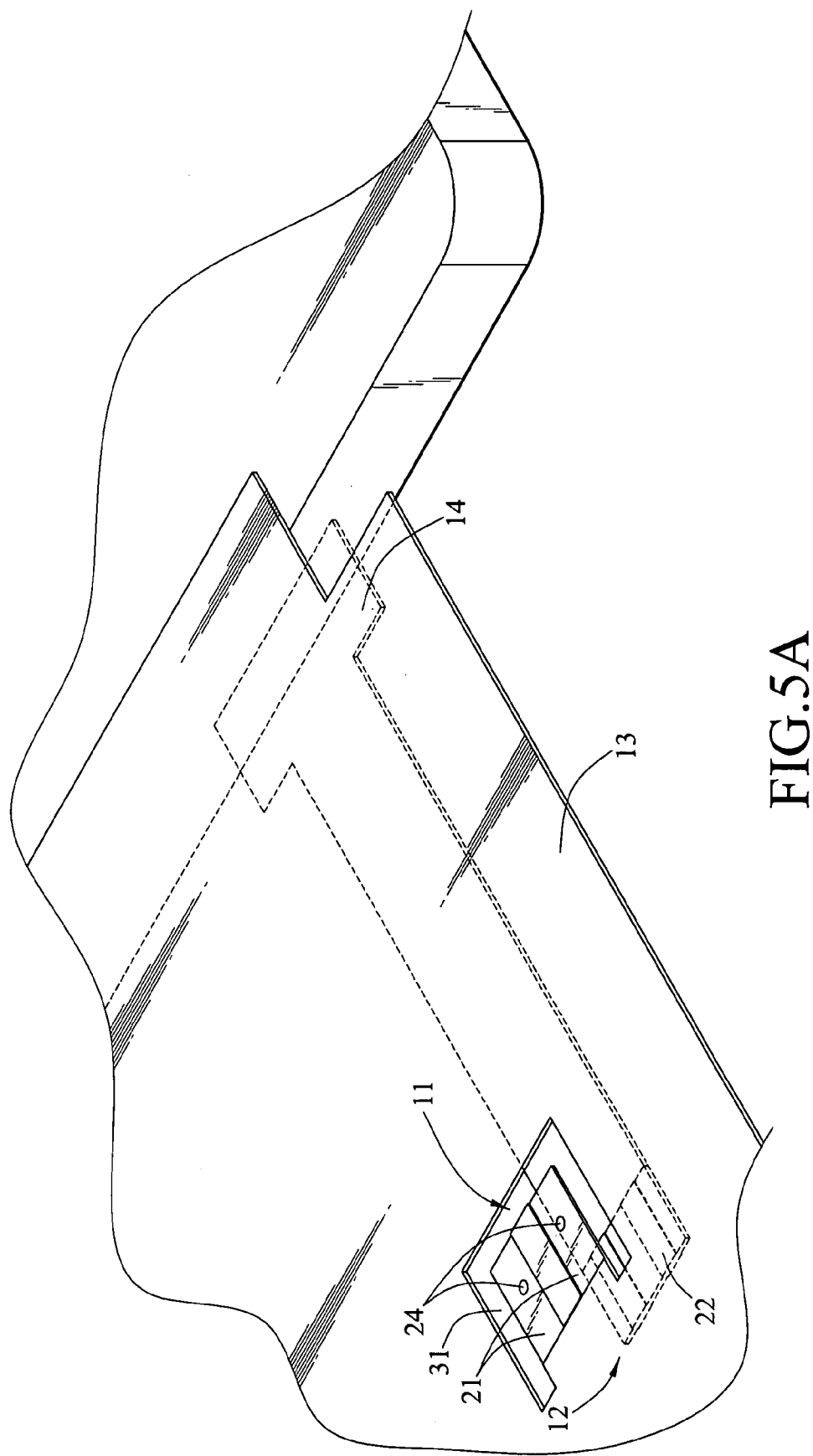
FIGS. 5A and 5B are schematic views of the first embodiment of the connecting structure of the flexible printed circuit board of the LCD module according to the present invention.

Referring to FIG. 5A, it is a schematic view of the first embodiment of the connecting structure of the flexible printed circuit board of the LCD module according to the present invention. As shown in FIG. 5A, the connecting structure of the flexible printed circuit board of the LCD module according to the present invention includes a first flexible printed circuit board 13 and a second flexible printed circuit board 14. The first flexible printed circuit board 13 is a double side printed circuit board structure, and the second flexible printed circuit board 14 is a single side printed circuit board structure. Both of the first flexible printed circuit board 13 and the second flexible printed circuit board 14 are flexible copper clad laminates. The first flexible printed circuit board 13 is a panel flexible printed circuit board connected to the LCD panel and the mainboard printed circuit board (not shown), so as to finish the signal transmission. The second flexible printed circuit board 14 is a light source flexible printed circuit board electrically connected to the light source (not shown) on the backlight module and the panel flexible printed circuit board, so as to serve as the carrier of the circuit.

The first flexible printed circuit board 13 has a solder element 11 with two opposite solder surfaces and a U-shaped opening 31 partially surrounding the solder element 11, wherein the solder element 11 is preferred tongue-shaped but not limited, and neighbors the opening 31. Moreover, the solder element 11 further includes a plurality of first pads 21 made of metal material, and a plurality of plated through holes (PTHs) 24 formed on the first pads 21, wherein the PTHs 24 pass through the first pads 21 and the first flexible printed circuit board 13. Further, the first pad 21 may be of metal material, such as copper, tin, nickel, gold, and aluminum.

The second flexible printed circuit board 14 has an extending portion, and the end of the extending portion has a conducting surface 12 made of copper material. The conducting surface 12 may be formed on the upper surface or the lower surface of the second flexible printed circuit board 14, and each conducting surface 12 includes a plurality of second pads 22.

Figure 5B:
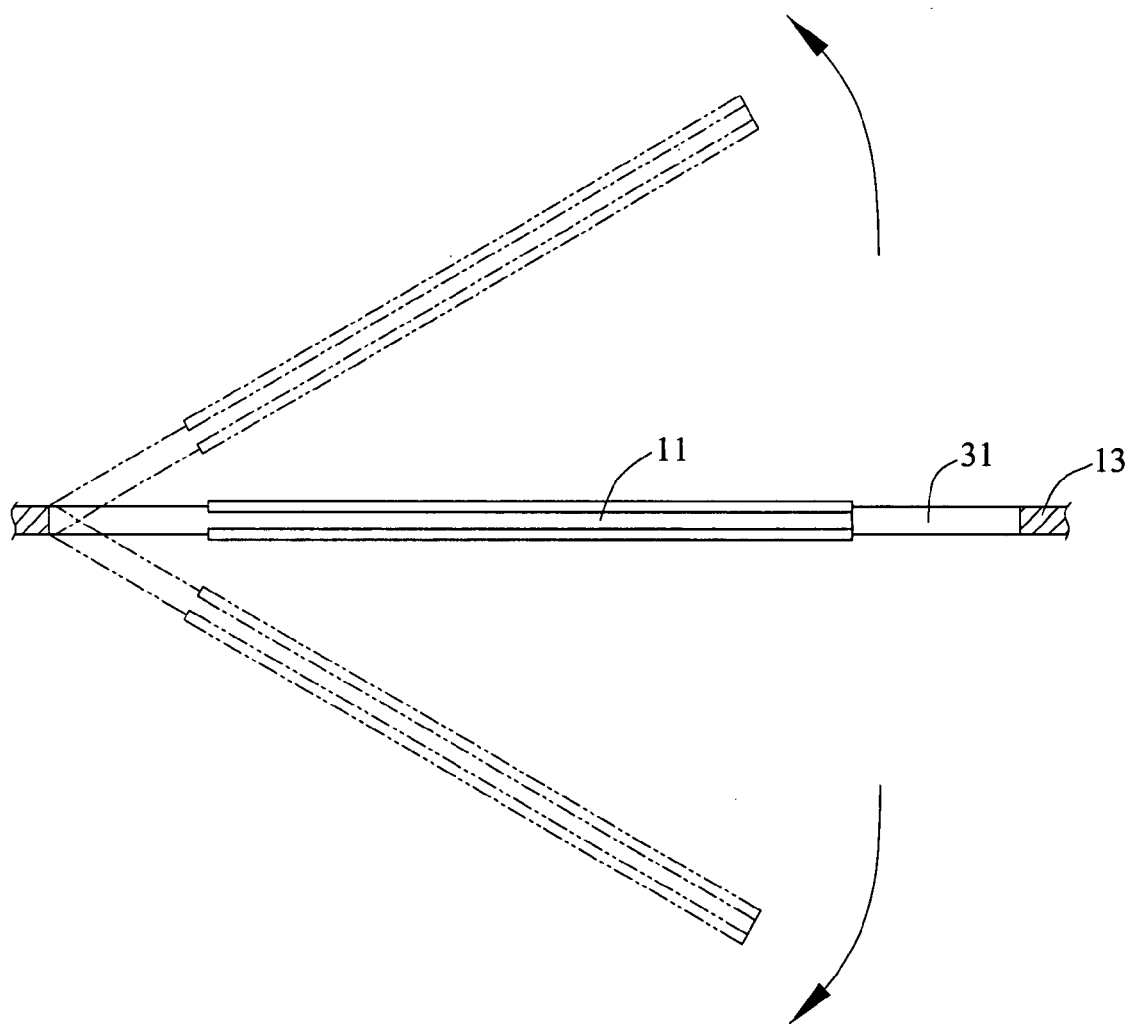

As shown in FIG. 5B, it is a side view of the first flexible printed circuit board 13 according to the present invention. Because of the special U-shaped opening 31 formed on the first flexible printed circuit board 13 and the property of the flexible circuit board, the tongue-shaped solder element 11 can be rotated in a predetermined angle with respect to the first flexible printed circuit board 13.

The area of the first pad 21 on the solder element 11 is larger than the area of the second pad 22 on the conducting surface 12. The conducting surface 12 may select to directly contact the corresponding solder surface or to contact another corresponding solder surface by passing through the opening 31, such that the second pad 22 is connected to the first pad 21 on the solder surface. After the bonding operation on one side of the solder element 11 is finished, a part of the solder located on the second pad 22 spills to the first pad 21 on the other side of the solder element 11 through the PTHs 24. Here, the opening 31 may also provide another function, i.e. when the amount of the solder on the second pad 22 is large, a part of the solder spills and passes through the opening 31 and connects to the solder surface on the other side. That is, the first pads 21 on the two sides of the first flexible printed circuit board 13 are at least partially covered by tin, together with the tin passing through the PTHs 24, so as to increase the area of contacting surface between the first pad 21, the second pad 22 and the tin, thus improving the bonding strength of the first flexible printed circuit board 13 and the second flexible printed circuit 14. Similarly, the effect is suitable for the following several embodiments.

Figure 6:
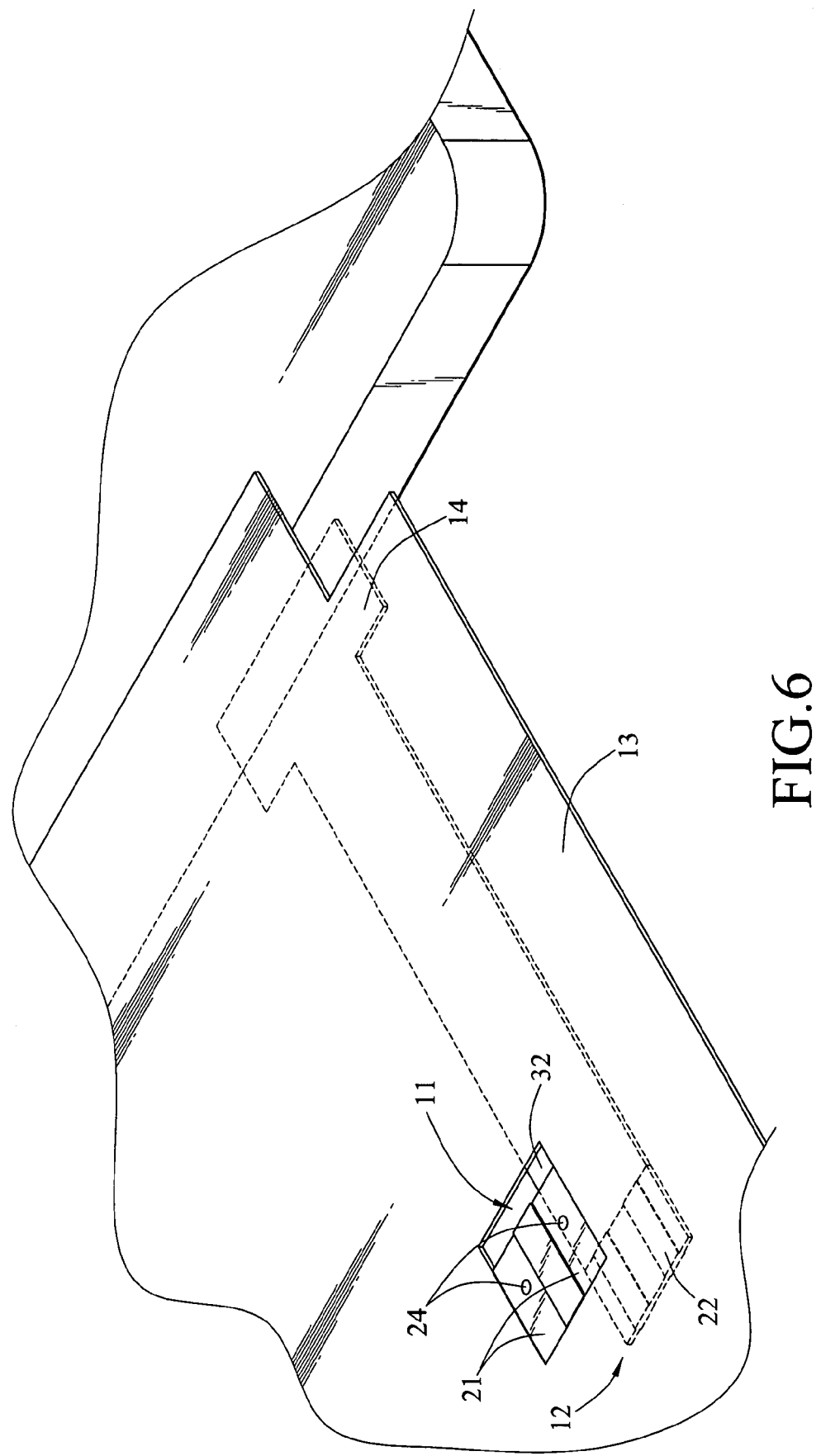
FIG. 6 is a schematic view of the second embodiment of the connecting structure of the flexible printed circuit board of the LCD module according to the present invention.

Referring to FIG. 6, it is a schematic view of the second embodiment of the connecting structure of the flexible printed circuit board of the LCD module according to the present invention. As shown in FIG. 6, the connecting structure of the flexible printed circuit board of the LCD module according to the present invention includes a first flexible printed circuit board 13 and a second flexible printed circuit board 14. The difference between this embodiment and the first embodiment is that the opening 32 in this embodiment is tetragon-shaped or similar and the solder element 11 cannot be rotated.

The first flexible printed circuit board 13 of this embodiment has a solder element 11 with two solder surfaces and a tetragon-shaped opening 32, wherein the solder element 11 neighbors the opening 31 and cannot be rotated. Moreover, the solder surface 11 further includes a plurality of first pads 21, on which at least a PTH 24 is formed.

The second flexible printed circuit board 14 has an extending portion, and the end of the extending portion has a conducting surface 12. The conducting surface 12 includes a plurality of second pads 22. The connecting situations of the first flexible printed circuit board 13 and the second flexible printed circuit board 14 in the first embodiment and the second embodiment are described below by the description of the connecting structure in the first embodiment with drawings.

As shown in FIGS. 7A to 7D, another preferred embodiment of the connecting structure of the first flexible printed circuit board with U-shaped opening 31 and the second flexible printed circuit board according to the present invention is shown. The solder element 11 of the first flexible printed circuit board 13 and the conducting surface 12 of the second flexible printed circuit board 14 may have different connecting manners, according to the different structural designs of the first flexible printed circuit board 13 and the second flexible printed circuit board 14.

Figure 7A:
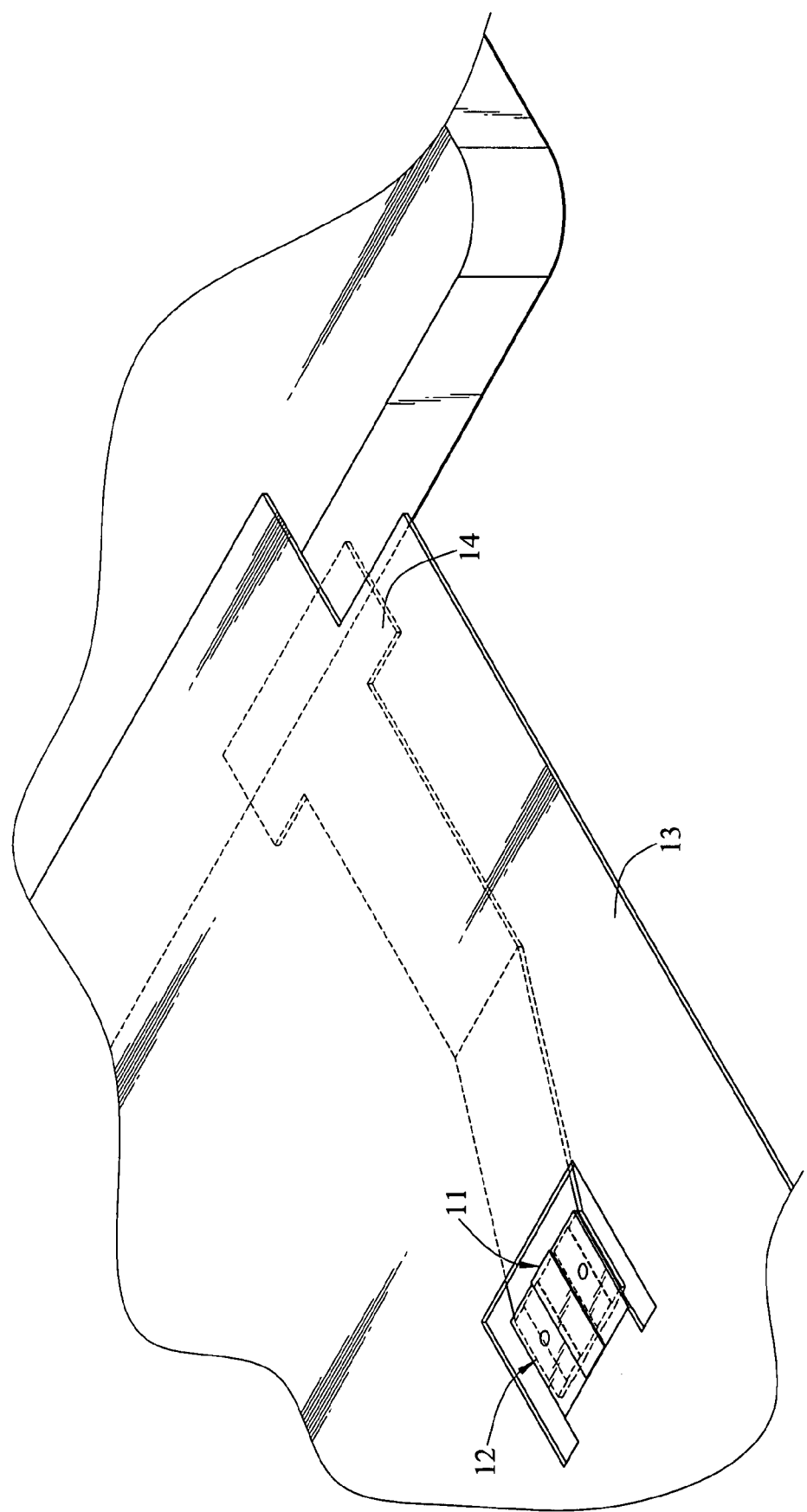
FIGS. 7A, 7B, 7C and 7D are schematic views of the connecting structure of the first flexible printed circuit board with a U-shaped opening and the second flexible printed circuit board according to the present invention.

As shown in FIG. 7A, the conducting surface 12 of the second flexible printed circuit board 14 is formed on the upper surface, and may be directly connected to the lower solder surface of solder element 11, which is on the same side of the lower surface of the first flexible printed circuit board 13.

Figure 7B:
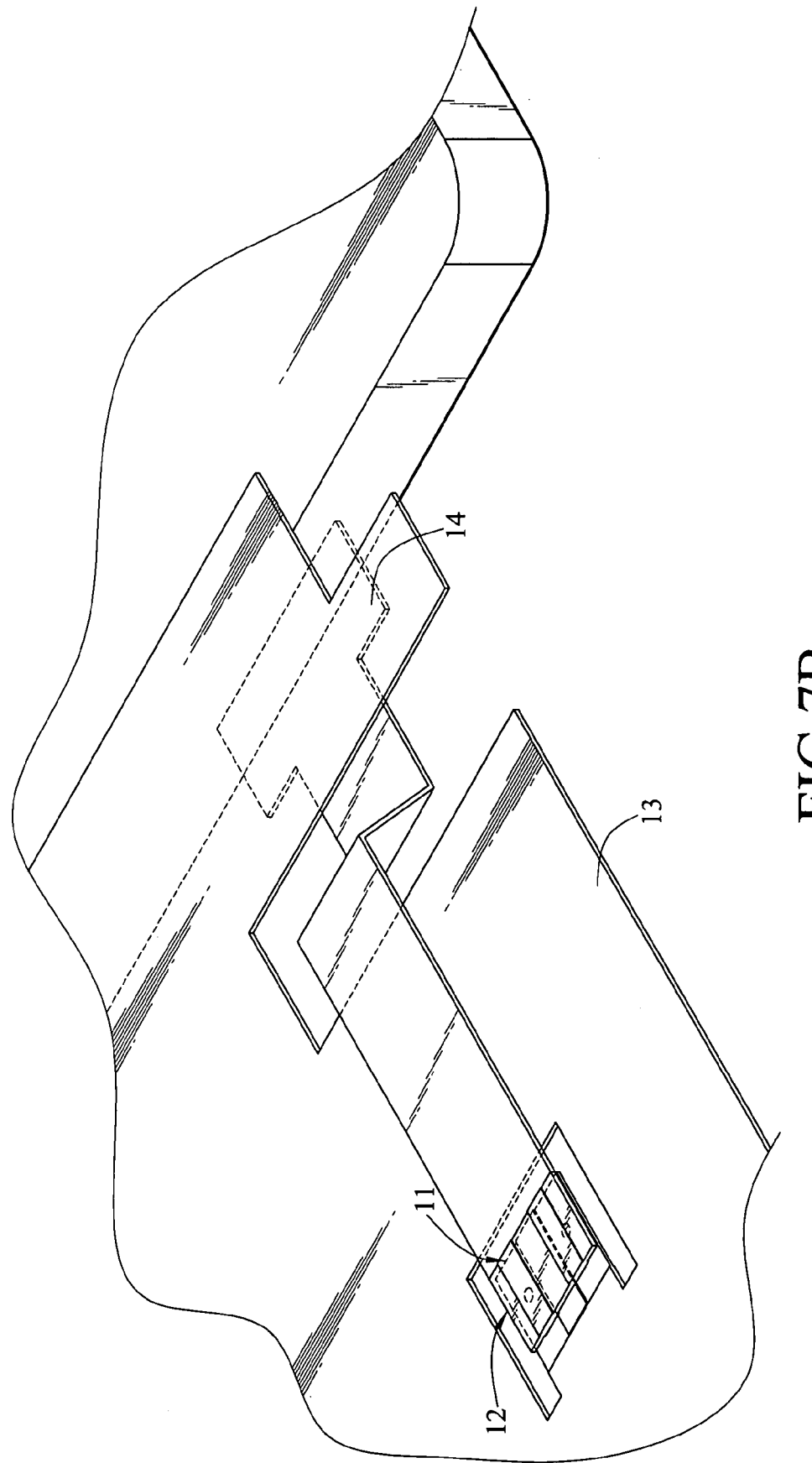

As shown in FIG. 7B, the conducting surface 12 of the second flexible printed circuit board 14 is formed on the lower surface, it may match the configuration of the first flexible printed circuit board 13 to be placed the upper surface of the first flexible printed circuit board 13, so as to be connected to the upper solder surface of solder element 11, which is on the same side of the upper surface of the first flexible printed circuit board 13.

Figure 7C:
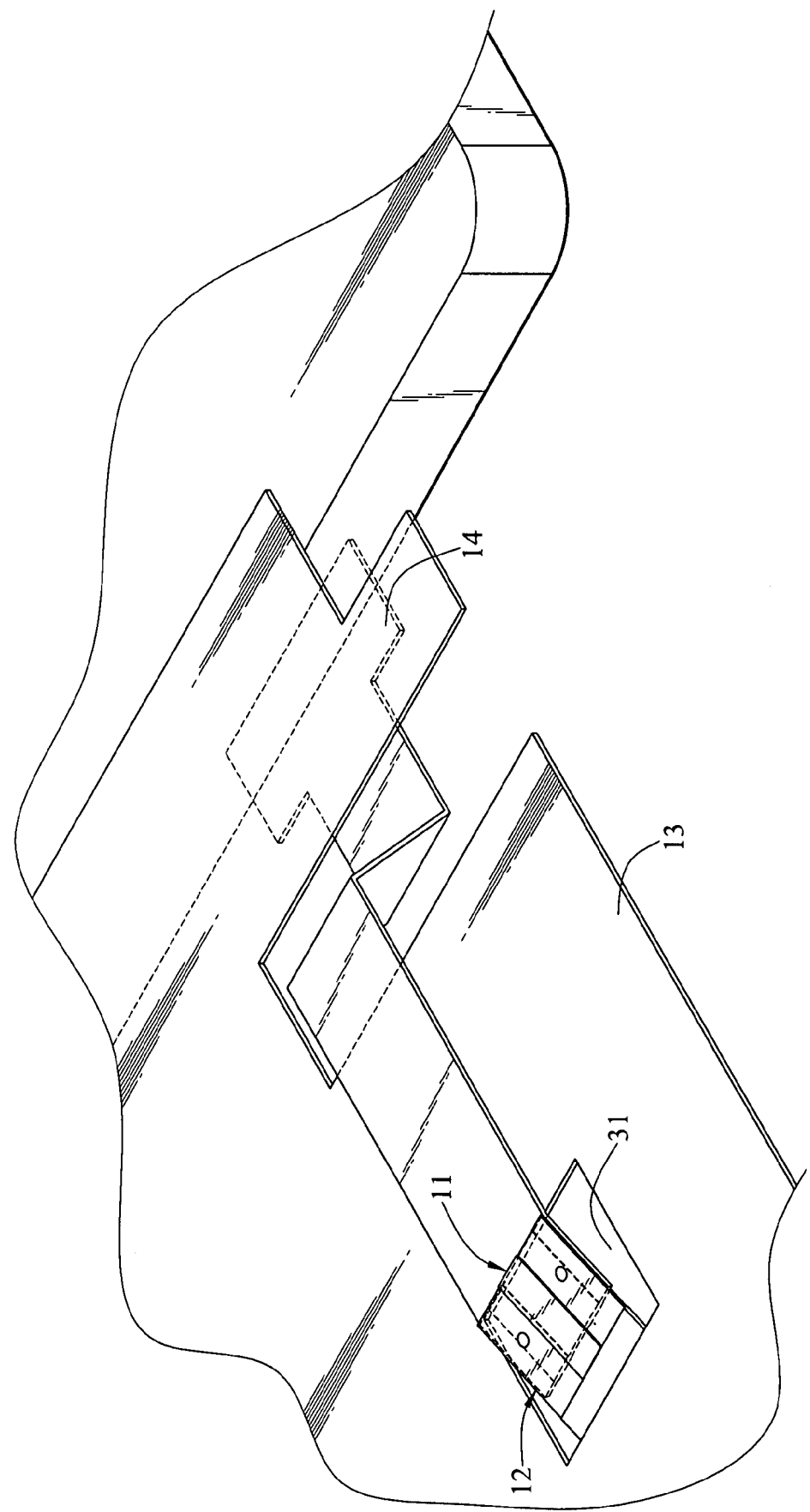

As shown in FIG. 7C, by the design of the opening 31, the conducting surface 12 formed on the upper surface of the second flexible printed circuit board 14 may pass through the opening 31 from the upper surface of the first flexible printed circuit board 13, so as to be connected to the lower solder surface of solder element 11, which is on the same side of the lower surface of the first flexible printed circuit board 13.

Figure 7D:
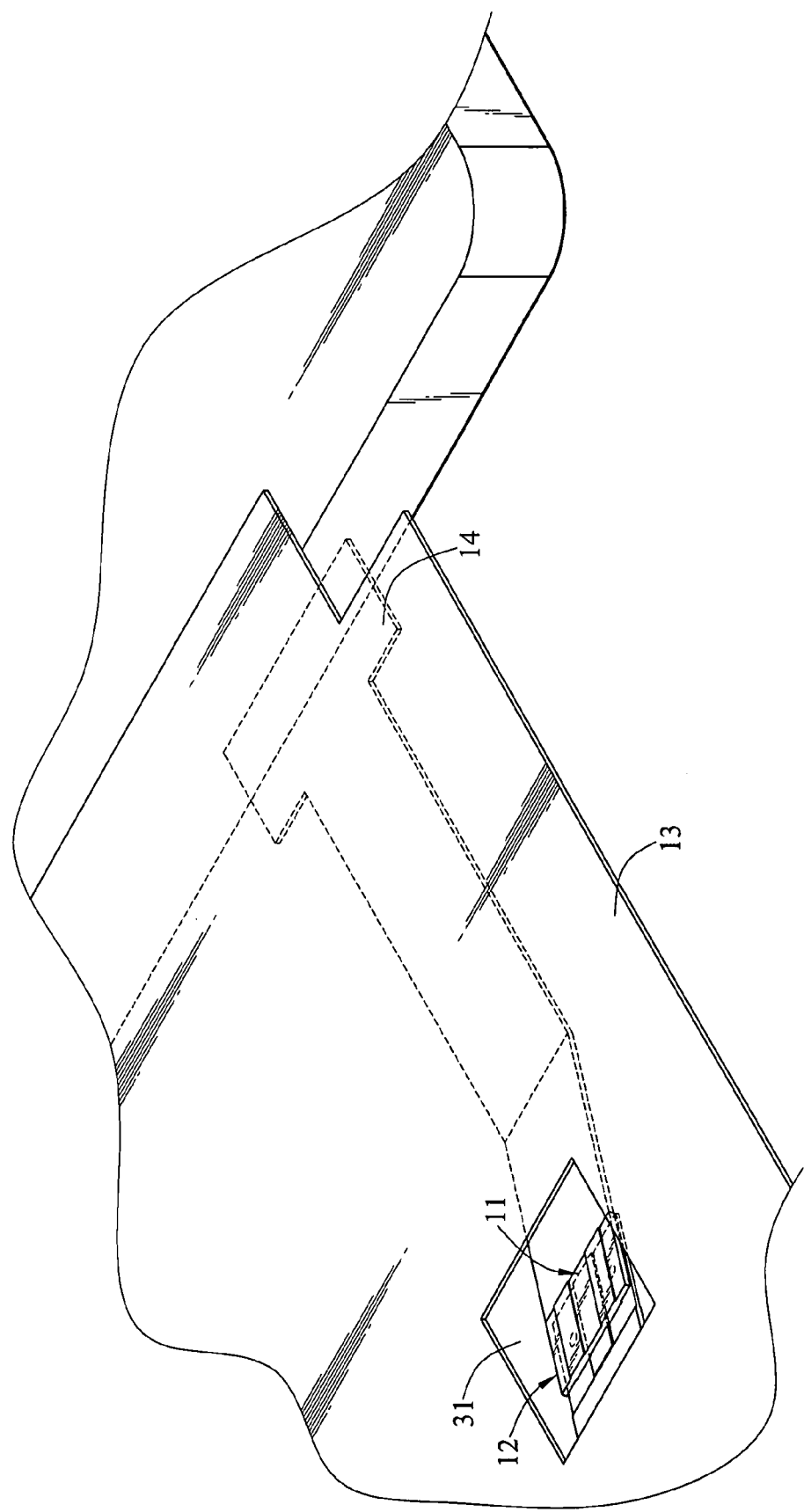

As shown in FIG. 7D, the conducting surface 12 formed on the lower surface of the second flexible printed circuit board 14 may pass through the opening 31 from the lower surface of the first flexible printed circuit board 13, so as to be connected to the upper solder surface of solder element 11, which is on the same side of the upper surface of the first flexible printed circuit board 13.

By the connecting structure of the flexible printed circuit board of the LCD module according to the present invention, during the bonding operation, the solder may go deep into the first flexible printed circuit board by the PTHs, so as to obtain the favorable tin feeding effect, thus enhancing the strength structure of the bonding position, and avoiding false bonding and clod solder joint. Moreover, by the unique opening design on the first flexible printed circuit board, the conducting surface may select one of the two corresponding solder surfaces of a solder element to perform connecting according to the structural requirements.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connecting structure applied in a liquid crystal display module, comprising:
    a double side printed circuit board having a solder element with two opposite solder surfaces and an opening partially surrounding the solder element;
    a plurality of first pads disposed on the solder surfaces with at least a plated through holes formed on the first pads;
    a single side printed circuit board having an extending portion with a conducting surface near the end of the extending portion; and
    a plurality of second pads disposed on the conducting surface;
    wherein the second pads are connected to the first pads on one of the two solder surfaces by welding.

2. The connecting structure as claimed in claim 1, wherein the conducting surface passes through the opening from one side of the double side printed circuit board and contacts the corresponding solder surface on the other side of the double side printed circuit board, such that the second pads are connected to the first pads on the corresponding solder surface by welding.

3. The connecting structure as claimed in claim 2, wherein the solder element is rotated in a predetermined angle with respect to the double side printed circuit board.

4. The connecting structure as claimed in claim 1, wherein the double side printed circuit board and the single side printed circuit board are flexible printed circuit boards.

5. The connecting structure as claimed in claim 4, wherein the double side printed circuit board and the single side printed circuit board are flexible copper clad laminates.

6. The connecting structure as claimed in claim 4, wherein the liquid crystal display module comprises a display panel, and the double side printed circuit board electrically connects to the display panel.

7. The connecting structure as claimed in claim 4, wherein the liquid crystal display module comprises a backlight module having a light source, and the single side printed circuit board electrically connects to the light source.

8. The connecting structure as claimed in claim 1, wherein the opening is a U-shaped or tetragon-shaped opening.

9. The connecting structure as claimed in claim 1, wherein the first and the second pads are formed by metal material.

10. The connecting structure as claimed in claim 9, wherein the metal material is copper, tin, nickel, gold or aluminum.

11. The connecting structure as claimed in claim 1, wherein the single side printed circuit board has an upper surface and a lower surface, and the conducting surface is disposed on the upper surface or on the lower surface.

* * * * *